US006999488B2

(12) United States Patent
Tsunoda

(10) Patent No.: US 6,999,488 B2
(45) Date of Patent: Feb. 14, 2006

(54) SEMICONDUCTOR LASER DEVICE CAPABLE OF PREVENTING A THRESHOLD CURRENT AND AN OPERATING CURRENT FROM INCREASING AND MANUFACTURING METHOD THEREFOR

(75) Inventor: Atsuo Tsunoda, Kashiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 190 days.

(21) Appl. No.: 10/602,827

(22) Filed: Jun. 25, 2003

(65) Prior Publication Data
US 2005/0100067 A1 May 12, 2005

(30) Foreign Application Priority Data
Jul. 16, 2002 (JP) .............................. 2002-206873

(51) Int. Cl.
*H01S 5/00* (2006.01)
(52) U.S. Cl. .................................. 372/46.01; 372/45.01
(58) Field of Classification Search ................. 372/43, 372/45, 46, 49, 75, 46.01, 45.01; 257/103
See application file for complete search history.

(56) References Cited

U.S. PATENT DOCUMENTS 5,956,361 A * 9/1999 Ikeda et al. .................... 372/46
6,181,723 B1 * 1/2001 Okubo et al. .................. 372/45
6,377,598 B1 * 4/2002 Watanabe et al. .............. 372/46
6,670,643 B1 * 12/2003 Hirukawa ...................... 372/45
6,775,311 B1 * 8/2004 Hirukawa ...................... 372/46
6,865,202 B1 * 3/2005 Matsumoto .................... 372/45

FOREIGN PATENT DOCUMENTS

| JP | 05-007050 | 1/1993 |
| JP | 06-268317 | 9/1994 |
| JP | 07-045901 | 2/1995 |
| JP | 08-321656 | 12/1996 |

* cited by examiner

*Primary Examiner*—Minsun Oh Harvey
*Assistant Examiner*—Tuan N. Nguyen
(74) *Attorney, Agent, or Firm*—Morrison & Foerster LLP

(57) ABSTRACT

A ridge section constructed of a p-type second AlGaInP clad layer 8, a p-type GaInP interlayer 9 and a p-type GaAs cap layer 10 is formed on an etching stop layer 7. A step of not smaller than 0.13 μm is formed between the p-type interlayer 9 and the p-type second clad layer 8 by making the p-type interlayer 9 protrude in both widthwise directions beyond the p-type second clad layer 8. With this step, AlInP layers can be formed separately from each other on both sides of the ridge section and on the ridge section. Therefore, when the AlInP layer on the ridge section is removed by etching, an AlInP current constriction layer 13 located on both sides of the ridge section is reliably protected by a resist film and not over-etched. The AlInP current constriction layer 13 effectively puts a current constriction function into effect, so that a semiconductor laser device of low-threshold current and low-power consumption is obtained.

4 Claims, 9 Drawing Sheets

SEMICONDUCTOR LASER DEVICE CAPABLE OF PREVENTING A THRESHOLD CURRENT AND AN OPERATING CURRENT FROM INCREASING AND MANUFACTURING METHOD THEREFOR

BACKGROUND OF THE INVENTION

The present invention relates to a semiconductor laser device and semiconductor laser device manufacturing method.

Recently, AlGaInP-based red semiconductor laser devices capable of emitting light at a wavelength in a 600-nm band have been increasingly used as light sources of a pointer, a bar-code reader, a laser beam printer and optical disk devices, acquiring greater importance.

As a semiconductor laser device of this type, there has been one as shown in FIG. 7. This semiconductor laser device is a ridge stripe type, in which a ridge section formed of a p-type second clad layer 108, a p-type interlayer 109 and a p-type cap layer 110 is formed so as to be embedded in an n-type current constriction layer 113 and a p-type contact layer 116 by the MBE method.

The above-mentioned conventional semiconductor laser device is manufactured as follows. That is, as shown in FIG. 8A, an n-type GaAs buffer layer 102, an n-type GaInP buffer layer 103, an n-type AlGaInP clad layer 104, a GaInP/AlGaInP multiple quantum well active layer 105, a p-type first AlGaInP clad layer 106, a GaInP etching stop layer 107, a p-type second AlGaInP clad layer 108, a p-type GaInP interlayer 109 and a p-type GaAs cap layer 110 are successively grown by the MBE method on an n-type GaAs substrate 101 that has a plane, which is inclined at an angle of 15° toward the [011] direction from the (100) plane, as its principal plane.

Subsequently, an $Al_2O_3$ film 111 is vapor deposited on the p-type cap layer 110, and this $Al_2O_3$ film 111 is processed by patterning through photoetching into a stripe shape.

Subsequently, etching is carried out using a resist film 112, which has been used for the pattern processing of the $Al_2O_3$ film 111, as a mask to remove both side portions of the p-type second clad layer 108, the p-type interlayer 109, the p-type cap layer 110 and the $Al_2O_3$ film 111, forming a ridge section as shown in FIG. 8B.

Subsequently, the resist film 112 is removed, and thereafter, the $Al_2O_3$ film 111 is removed by etching. Then, second-time crystal growth is carried out by the MBE method, growing n-type AlInP on the GaInP etching stop layer 107 and the ridge section (FIG. 8C). At this time, a single-crystal AlInP layer 113, which becomes a current constriction layer, is formed on the GaInP etching stop layer 107, and a polycrystalline AlInP layer 114 is grown on the p-type cap layer 110 of the ridge section.

Subsequently, a resist is coated on the n-type AlInP current constriction layer 113 and the AlInP layer 114 by a spinner. At this time, a resist film 115 is formed on the n-type AlInP current constriction layer 113, whereas the resist film is scarcely formed on the polycrystalline AlInP layer 114.

Subsequently, the resist on the AlInP layer 114 is completely removed by $O_3$-UV ashing, so that the resist film 115 is disposed only on the n-type AlInP current constriction layer 113 as shown in FIG. 9A.

Then, the polycrystalline AlInP layer 114 is removed by etching using the resist film 115 as a mask as shown in FIG. 9B.

Subsequently, the resist 115 is removed as shown in FIG. 9C.

Subsequently, a p-type GaAs contact layer 116 is formed through crystal growth by third-time MBE method, and electrodes 117 and 118 are formed on the upper surface of this p-type contact layer 116 and the lower surface of the n-type GaAs substrate 101, respectively, obtaining an AlGaInP-based red semiconductor laser device as shown in FIG. 7.

However, the above-mentioned semiconductor laser device manufacturing method has a problem that the n-type AlInP current constriction layer 113 located on both sides of the ridge section is excessively etched when the polycrystalline AlInP layer 114 is removed by etching during the process shown in FIG. 9B and the operating current value of the semiconductor laser device consequently increases.

This is ascribed to the fact that the portion formed on the side surfaces of the ridge section in the n-type AlInP current constriction layer 113 formed through the process shown in FIG. 8C has a crystal structure more prone to etching than the portion formed on the GaInP etching stop layer 107. The portion of the n-type AlInP layer 113, which is formed on the side surfaces of the ridge section and is brought in contact with the AlInP layer 114, is etched by the etchant used when the polycrystalline AlInP layer 114 is removed by etching. As a result, over-etching occurs in the portions located on the side surfaces of the ridge section in the n-type AlInP current constriction layer 113. P-type GaAs enters these over-etched portions during third-time crystal growth by the MBE method. Since this GaAs absorbs light generated in the active layer, the light confinement effect of the ridge section is reduced, and external differential quantum efficiency is reduced, disadvantageously increasing a threshold current value and an operating current value.

SUMMARY OF THE INVENTION

Accordingly, the object of the present invention is to provide a red semiconductor laser device capable of preventing the threshold current value and the operating current value from increasing and a manufacturing method therefor.

In order to achieve the above object, there is provided a semiconductor laser device, which is provided with an active layer and a first clad layer on a substrate and provided with a ridge section constructed of a second clad layer and upper layers including a cap layer on the first clad layer, the upper layer protruding in both widthwise directions beyond the second clad layer, providing a step of not smaller than 0.13 mm between the upper layers and the second clad layer. In this construction, when, for example, a current constriction layer is formed in an embedded style on both sides of the ridge section, a layer separated from the current constriction layer is concurrently formed on the ridge section. Therefore, the current constriction layer located on both sides of the ridge section and the layer located on the ridge section are formed without being brought in contact with each other, dissimilarly to the conventional case. With this arrangement, the conventional disadvantage that the current constriction layer is over-etched when the layer on the ridge section is removed is reliably eliminated. Therefore, leak of light from the ridge section and the like attributed to the over-etching of the current constriction layer located on both sides of the ridge section are effectively prevented. As a result, the threshold current value and the operating current value are prevented from increasing, and the threshold value can be made comparatively low, so that a semiconductor laser device of low power consumption is obtained.

It is to be noted that the layer located on the ridge section may include an interlayer together with a cap layer. Moreover, the first clad layer and the second clad layer may be integrally formed, and an etching stop layer or the like may be interposed.

In one embodiment of the present invention, a current constriction layer is provided on both sides of the ridge section, and a portion of the current constriction layer, the portion being located outside a portion brought in contact with the ridge section and having surfaces formed flatly, is formed to have a thickness smaller than a thickness of the second clad layer of the ridge section. Accordingly, when the layer concurrently formed on the ridge section during the formation of the current constriction layer is removed, a resist film or the like, which serves as a mask, is reliably formed on the entire current constriction layer. With this mask, the current constriction layer is reliably prevented from being over-etched when the layer located on the ridge section is removed by etching. As a result, the light confinement effect of the ridge section is sufficiently secured, so that a semiconductor laser device of a comparatively low threshold value and low power consumption is obtained.

In one embodiment of the present invention, a portion of the current constriction layer brought in contact with the ridge section has a thickness of not smaller than half a thickness of the second clad layer of the ridge section. With this arrangement, the second clad layer is formed so as to be brought in contact with the current constriction layer along more than half the thickness thereof. Therefore, light from the active layer is effectively confined, so that a semiconductor laser device of a comparatively low threshold value and low power consumption is obtained.

In one embodiment of the present invention, the substrate is an inclined substrate. Therefore, an active layer containing, for example, AlGaInP or the like, the first and second clad layers and so on are formed on the inclined substrate with high quality and reduced defect, so that a semiconductor laser device of satisfactory characteristics is obtained.

It is to be noted that the current constriction layer should preferably contain Al or more preferably be formed of AlInP. With this arrangement, a current constriction layer, which produces satisfactory current constriction effect, is obtained.

Also, there is provided a semiconductor laser device manufacturing method comprising the steps of:

forming at least an active layer, a first clad layer, a second clad layer and upper layers including a cap layer on a substrate; and forming a ridge section comprised of the second clad layer and the upper layers by subjecting the second clad layer and the upper layers to dry etching and subsequently to wet etching. This ridge section, which is formed by being subjected to dry etching for producing an anisotropic etching effect and subsequently subjected to wet etching for producing an isotropic etching effect, can therefore be effectively formed into the prescribed shape.

In one embodiment of the present invention, a step is easily and effectively formed between the upper layers and the second clad layer by making the upper layers protrude in both widthwise directions beyond the second clad layer by isotropical wet etching. As a result, a semiconductor laser device of comparatively low threshold value and low power consumption can be manufactured.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
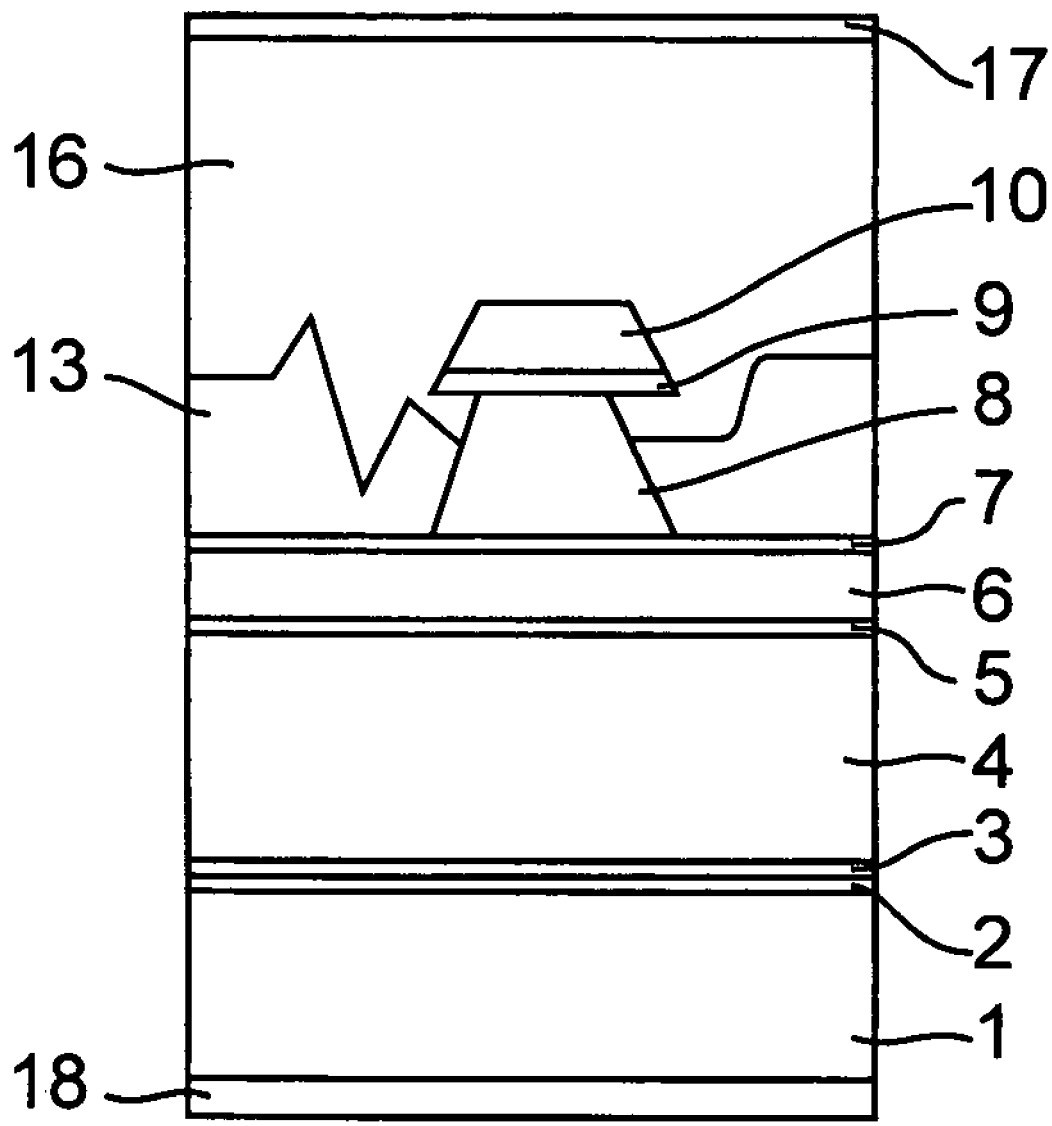
FIG. 1 is a view showing the semiconductor laser device of a first embodiment.

The present invention will be described in detail below on the basis of the embodiments thereof shown in the drawings.

FIG. 1 is a view showing the semiconductor laser device of the first embodiment. In this semiconductor laser device, an n-type GaAs buffer layer 2, an n-type GaInP buffer layer 3, an n-type AlGaInP clad layer 4, a GaInP/AlGaInP multiple quantum well active layer 5, a p-type first AlGaInP clad layer 6 and a GaInP etching stop layer 7 are successively laminated on an n-type GaAs substrate 1. A ridge section, which is constructed of a p-type second AlGaInP clad layer 8, and a p-type GaInP interlayer 9 and a p-type GaAs cap layer 10 serving as an upper layer, is formed on this GaInP etching stop layer 7. The p-type second clad layer 8 has a trapezoidal shape gradually narrowed upward in width. The p-type GaInP interlayer 9 and the p-type GaAs cap layer 10 also have a trapezoidal shape gradually narrowed upward in width. The ridge section is formed so that the p-type interlayer 9 protrudes in width from the p-type second clad layer 8, and the p-type second clad layer 8 and the p-type interlayer 9 form a step. On both sides of the p-type second clad layer 8, an n-type AlInP current constriction layer 13 is provided on the etching stop layer 7. A p-type GaAs contact layer 16 is formed on this n-type AlInP current constriction layer 13 and the ridge section. Electrodes 18 and 17 are arranged on the lower surface of the n-type GaAs substrate 1 and the upper surface of the p-type GaAs contact layer 16, respectively.

Figure 2A:
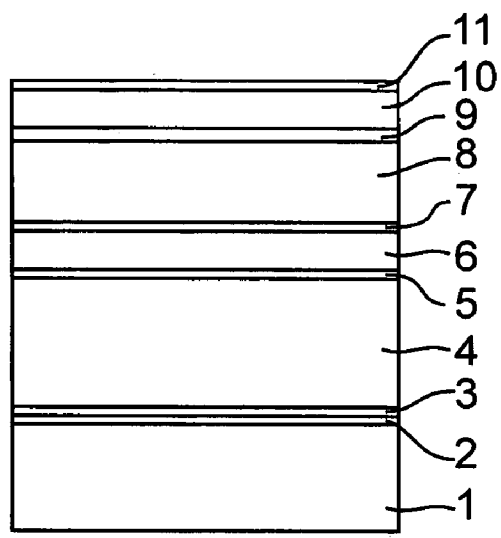
FIGS. 2A through 2C are views showing processes for manufacturing the semiconductor laser device of the first embodiment.

The semiconductor laser device of the present embodiment is manufactured as follows. First of all, as shown in FIG. 2A, the n-type GaAs buffer layer 2, the n-type GaInP buffer layer 3, the n-type AlGaInP clad layer 4, the GaInP/AlGaInP multiple quantum well active layer 5, the p-type first AlGaInP clad layer 6, the GaInP etching stop layer 7, the p-type second AlGaInP clad layer 8, the p-type GaInP interlayer 9 and the p-type GaAs cap layer 10 are successively grown on the n-type GaAs substrate 1 that has a plane inclined at an angle of 15° in the [011] direction from the (100) plane as its principal plane by the MBE method. Subsequently, an $Al_2O_3$ film 11 is vapor deposited.

Subsequently, photoetching is carried out to process the $Al_2O_3$ film 11 into a stripe shape. Thereafter, the photoresist is removed, and dry etching is carried out using the $Al_2O_3$ film 11 as a mask. By this dry etching, the p-type GaAs cap layer 10, the p-type GaInP interlayer 9 and the p-type second AlGaInP clad layer 8 located on both sides below the $Al_2O_3$ film 11 are removed. At this time, etching of the p-type second clad layer 8 is stopped partway with a prescribed thickness left so that the etching stop layer 7 is not exposed.

Figure 2B:
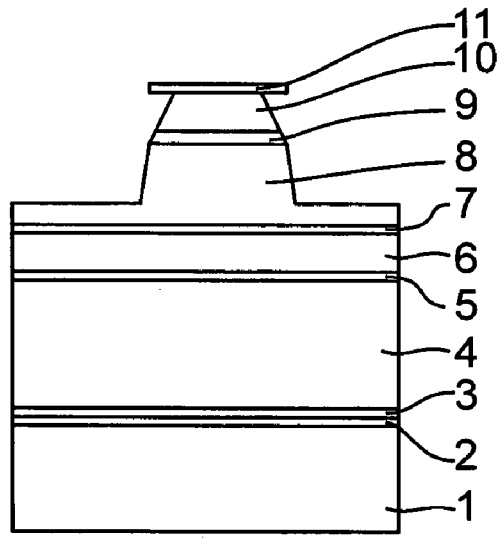

Subsequently, surface treatment is carried out with a bromine-based etchant to remove the deposit on the surface formed by the dry etching, and side surfaces vertically formed by the dry etching is slightly formed into a taper shape, slightly inclining the orientation of the side surfaces as shown in FIG. 2B. By this treatment, subsequent wet etching is stably achieved.

Figure 2C:
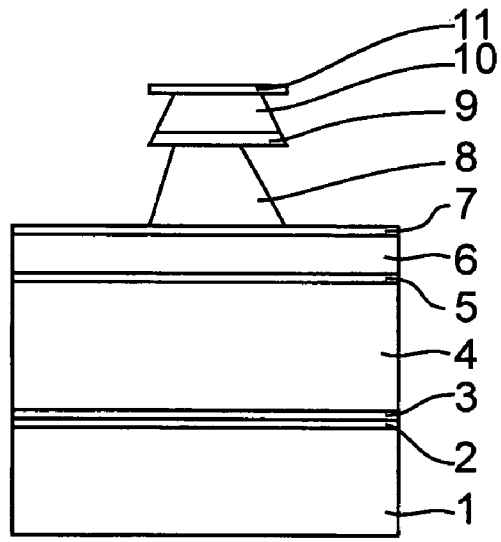

Then, the p-type second AlGaInP clad layer 8 is further etched by wet etching using heated phosphoric acid. That is, the p-type second clad layer 8 has its both side portions, located below the $Al_2O_3$ film 11, removed until the etching stops at the etching stop layer 7 and made to have a trapezoidal cross-section shape which is narrowed upward in width by side etching. This utilizes the property of phosphoric acid etching that tends to easily cause side etching. As described above, the dry etching that has anisotropy and is able to form the vertical surface is combined with the wet etching that is able to stop etching and causes side etching. Through this process, as shown in FIG. 2C, the ridge section, which has a step between the p-type second AlGaInP clad layer 8 and the p-type GaInP interlayer 9, can be formed. The dimension of the step is adjusted by etching time of the phosphoric acid etching. In the present embodiment, the dimension of the step is set to 0.13 μm.

Figure 3A:
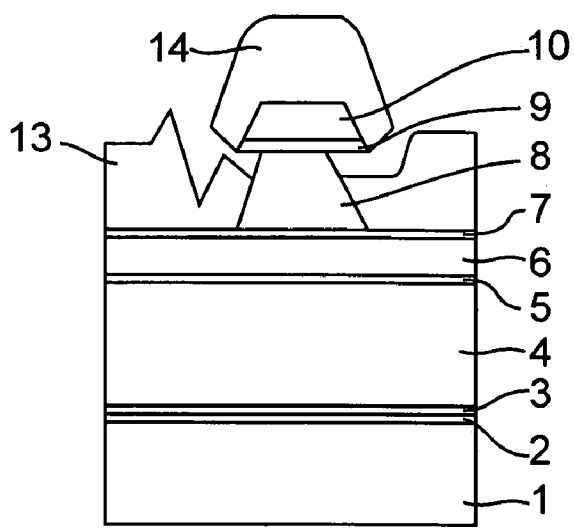
FIGS. 3A through 3C are views showing processes for manufacturing the semiconductor laser device of the first embodiment, continued from FIG. 2C.

Next, the $Al_2O_3$ film 11 on the ridge section is removed by etching, and thereafter, AlInP is crystallinically grown by second-time MBE method. As a result, as shown in FIG. 3A, a single-crystal n-type AlInP current constriction layer 13 is formed on both sides of the ridge section and on the etching stop layer 7, and a polycrystalline AlInP layer 14 is formed on the p-type GaAs cap layer 10. In this case, the n-type AlInP current constriction layer 13 and the polycrystalline AlInP layer 14 are formed with interposition of a gap without being connected to each other, dissimilarly to the conventional case. This is because the step of not smaller than 0.13 μm is provided between the p-type second clad layer 8 and the p-type interlayer 9.

The aforementioned crystal growth of AlInP is carried out by the MBE method. However, if the crystal growth is carried out by a method of, for example, the MOCVD method other than the MBE method, then the n-type AlInP current constriction layer 13 and the polycrystalline AlInP layer 14 are formed while being disadvantageously brought in contact with each other despite the fact that the step exists in the ridge section. Therefore, the crystal growth of AlInP is required to be carried out by the MBE method.

In this case, a semiconductor laser device was manufactured with the dimension of the step between the p-type second AlGaInP clad layer 8 and the p-type GaInP interlayer 9 set at 0.14 μm, and the yield of the semiconductor laser device became 72.3%. When the dimension of the step was set at 0.12 μm, the yield was significantly reduced to 35.9%. Therefore, the dimension of the step between the p-type second clad layer 8 and the p-type interlayer 9 should preferably be made equal to or greater than 0.13 μm.

Figure 3B:
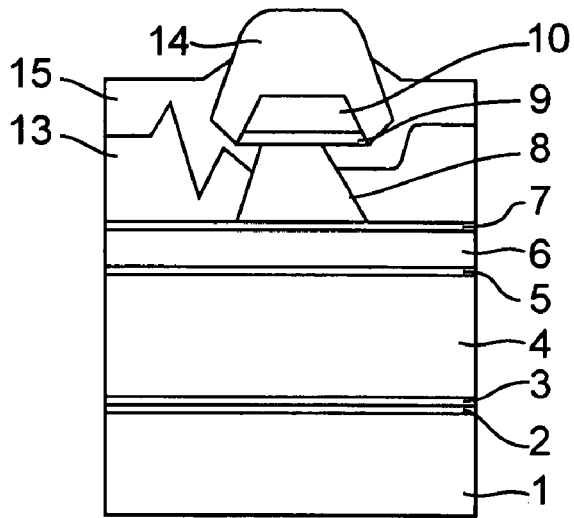

Subsequently, a resist is coated by a spinner. At this time, the resist is coated on the n-type AlInP current constriction layer 13, whereas the resist is scarcely coated on the polycrystalline AlInP layer 14. Moreover, the resist is infiltrated into a lower portion of the p-type interlayer 9 that forms the step through a gap between the n-type current constriction layer 13 and the polycrystalline AlInP layer 14. As a result, a resist film 15 is formed on the n-type current constriction layer 13 so as to separate the n-type current constriction layer 13 from the polycrystalline AlInP layer 14 (FIG. 3B).

Figure 3C:
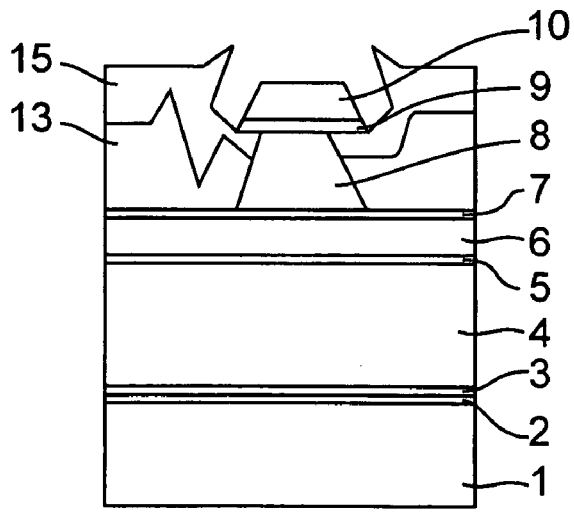

Subsequently, a small amount of resist, which adheres to the polycrystalline AlInP layer 14, is removed by $O_3$-UV ashing. Then, the polycrystalline AlInP layer 14 is removed by etching with the resist film 15 used as a mask (FIG. 3C). At this time, the resist film 15 is formed on the n-type current constriction layer 13 so as to separate the n-type current constriction layer 13 and the polycrystalline AlInP layer 14 from each other. Therefore, etchant for etching the polycrystalline AlInP layer 14 is reliably prevented from being brought in contact with the n-type current constriction layer 13. Therefore, the portion of the n-type current constriction layer brought in contact with the p-type second clad layer of the ridge section is not over-etched, dissimilarly to the conventional case. The reason why AlInP is used for the n-type current constriction layer 13 is that it is required to make the bandgap larger than that of the active layer for the reduction in waveguide loss and to make the refractive index smaller than that of the clad layer. Therefore, AlInP, which contains Al and has a comparatively high Al crystal mixture ratio, is suitable.

Figure 4A:
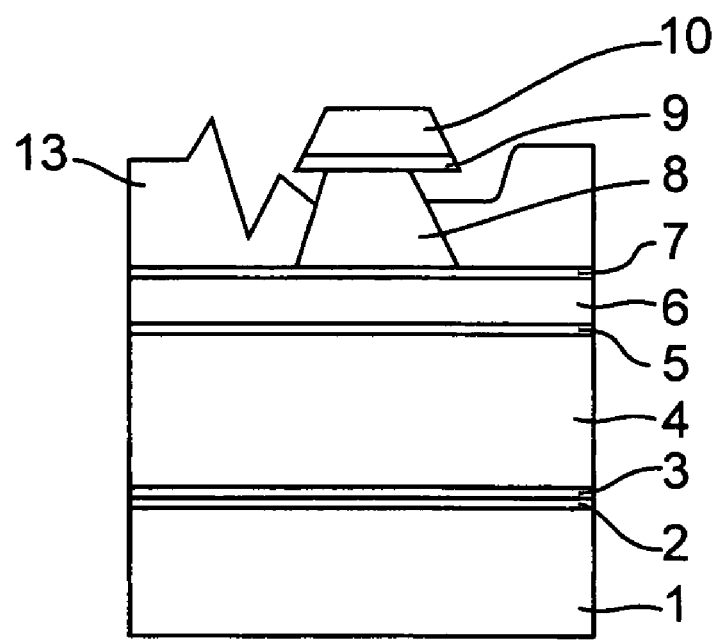
FIGS. 4A and 4B are views showing processes for manufacturing the semiconductor laser device of the first embodiment, continued from FIG. 3C.

Then, the resist 15 is subsequently removed (FIG. 4A).

Figure 4B:
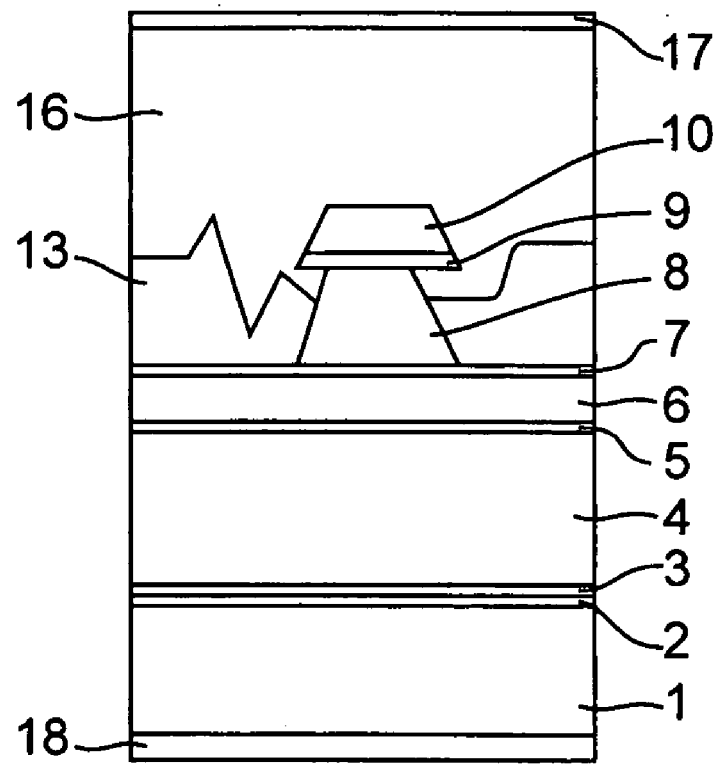

Subsequently, third-time MBE growth is carried out to form the p-type GaAs contact layer 16, and the electrodes 17 and 18 are formed on the upper surface of this p-type contact layer 16 and the lower surface of the n-type GaAs substrate 1, completing a semiconductor laser device as shown in FIG. 4B.

In the thus-manufactured semiconductor laser device, the n-type AlInP current constriction layer 13 is arranged with a prescribed thickness without being over-etched on both sides of the p-type second AlGaInP clad layer 8 of the ridge section. Therefore, the light confinement effect is appropriately secured by the p-type second clad layer 8, and light is not absorbed from the p-type second clad layer by the p-type GaAs, which enters the over-etched portion, dissimilarly to the conventional case. Therefore, an increase in the threshold current and an increase in the operating current value can be effectively prevented.

The manufacturing method of the semiconductor laser device of the second embodiment of the present invention will be described next. The semiconductor laser device manufactured in the present embodiment differs from that of the first embodiment only in the thickness of the flat portion of the current constriction layer 13 formed on both sides of the ridge section, and other conditions are the same as those of the first embodiment.

In the present embodiment, the same processes as those of the manufacturing method of the semiconductor laser device of the first embodiment are carried out up to the process shown in FIG. 2C. That is, similarly to the first embodiment, a ridge section, which has a step between the p-type second AlGaInP clad layer 8 and the p-type GaInP interlayer 9, is formed on the GaInP etching stop layer 7.

Figure 5A:
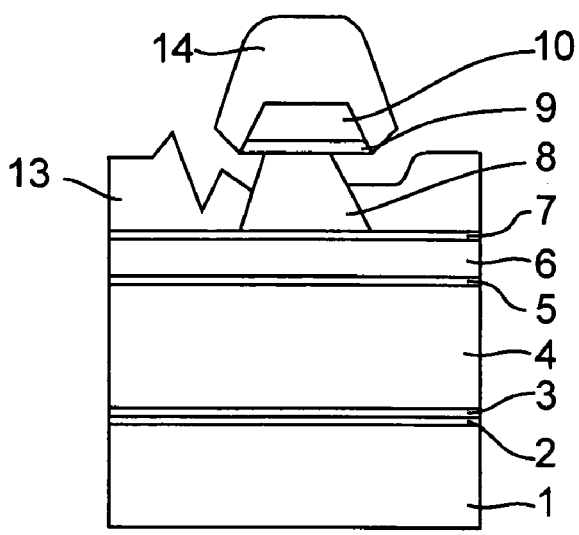
FIGS. 5A through 5C are views showing processes for manufacturing the semiconductor laser device of a second embodiment.

Subsequently, the Al$_2$O$_3$ film 11 is removed by etching, and thereafter, AlInP is crystallinically grown by second-time MBE growth. Through this process, as shown in FIG. 5A, an n-type AlInP current constriction layer 13 is formed on the GaInP etching stop layer 7 located on both sides of the ridge section, and a polycrystalline AlInP layer 14 is formed on a p-type GaAs cap layer 10.

In this case, according to the present embodiment, the thickness of a portion of the n-type AlInP current constriction layer 13, which is located outside the portion brought in contact with the ridge section and has a surface formed flatly, is made smaller than the thickness of the p-type second AlGaInP clad layer 8 of the ridge section. Moreover, the thickness of the portion of the n-type current constriction layer 13 brought in contact with the ridge section is formed to have a thickness half the thickness of the p-type second clad layer 8 of this ridge section.

In this case, if the thickness of the portion of the n-type AlInP current constriction layer 13, which is located outside the portion brought in contact with the ridge section and has the surface formed flatly, is made thicker than the thickness of the p-type second clad layer 8 when the step of the ridge section has a dimension of, for examples 0.13 μm, then a distance between the lower surface of the p-type GaInP interlayer 9 that forms the step of the ridge section and the surface of the n-type current constriction layer 13 becomes equal to or smaller than 500 Å. Then, it becomes difficult for the resist to enter the above-mentioned gap during resist coating, and the protection of the n-type current constriction layer 13 becomes insufficient, increasing the possibility of the over-etching of the n-type current constriction layer 13 during the etching of the polycrystalline AlInP layer 14.

Moreover, if the thickness of the portion of the n-type AlInP current constriction layer 13 brought in contact with the ridge section is thinner than half the thickness of the p-type second clad layer 8 of this ridge section, then the waveguide loss of this p-type second clad layer 8 increases to reduce the external differential quantum efficiency, disadvantageously increasing the threshold current value and the operating current value of the semiconductor laser device.

Figure 5B:
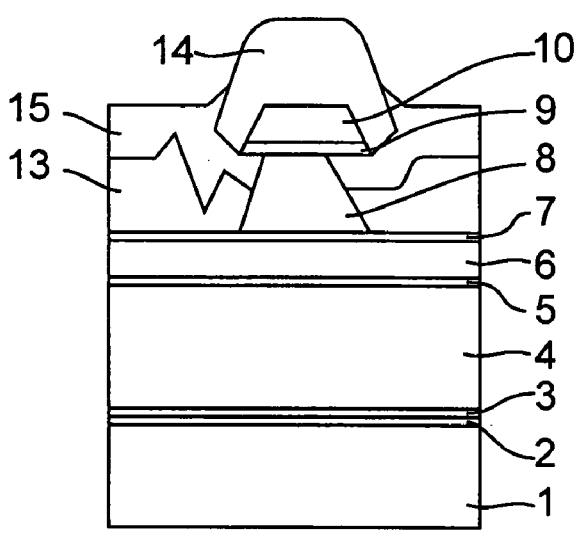

Subsequently, similarly to the first embodiment, a resist is coated principally on the n-type AlInP current constriction layer 13 by a spinner. At this time, the resist is scarcely coated on the polycrystalline AlInP layer 14. The resist infiltrates into a lower portion of the p-type interlayer 9 that forms the step through a gap between the n-type current constriction layer 13 and the polycrystalline AlInP layer 14 and is coated entirely on the n-type AlInP current constriction layer 13. Then, unnecessary resist is removed by O$_3$-UV ashing, so that the resist film 15 is arranged only on the n-type AlInP current constriction layer 13 as shown in FIG. 5B.

Figure 5C:
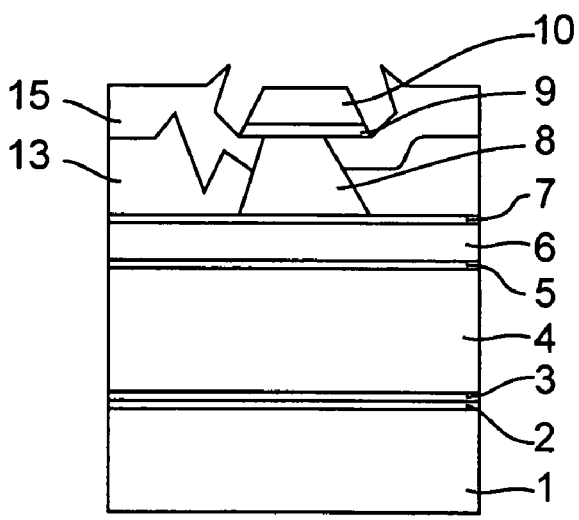

Then, as shown in FIG. 5C, the polycrystalline AlInP layer 14 is removed by etching using the resist film 15 as a mask.

Figure 6A:
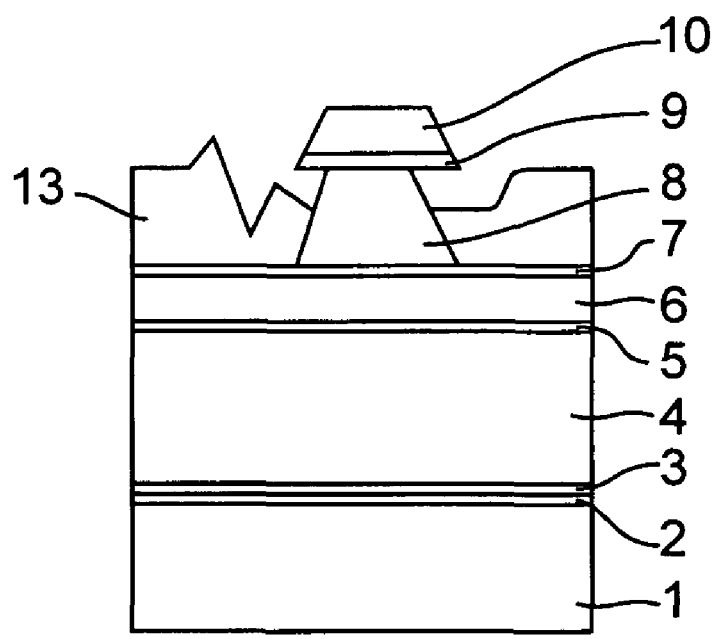
FIGS. 6A and 6B are views showing processes for manufacturing the semiconductor laser device of the second embodiment, continued from FIG. 5C.

Subsequently, the resist film 15 is removed as shown in FIG. 6A.

Figure 6B:
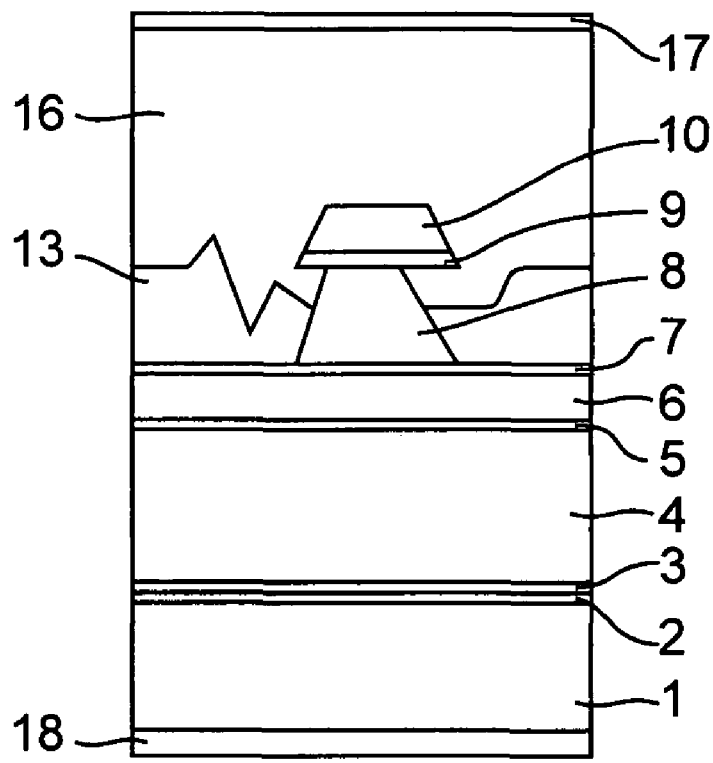
Figure 7:
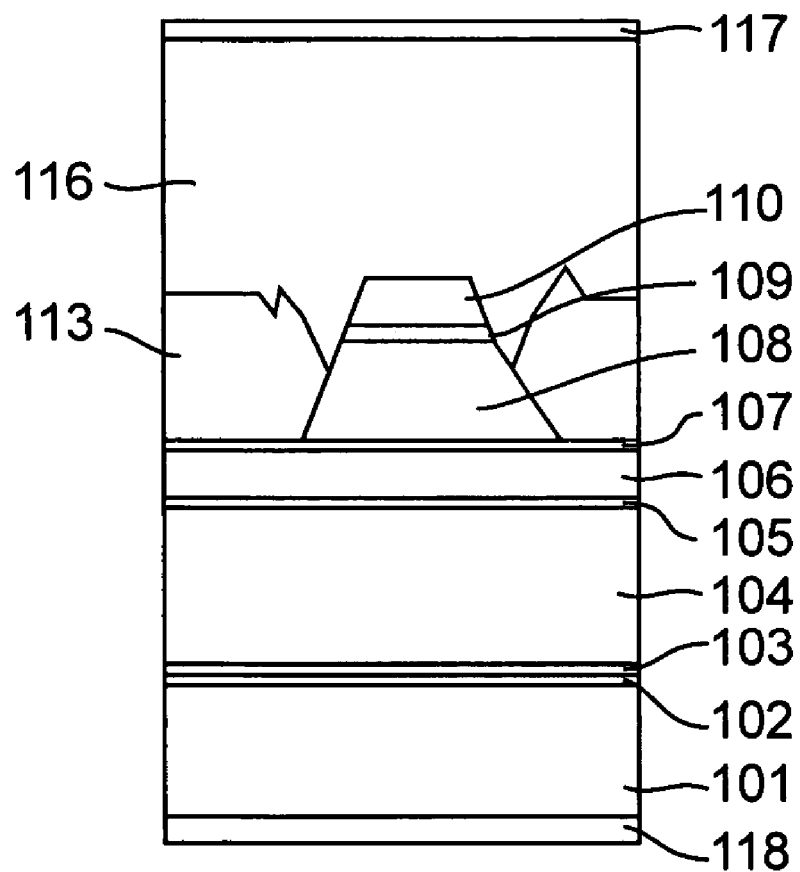
FIG. 7 is a view showing a conventional semiconductor laser device of the background art.
Figure 8A:
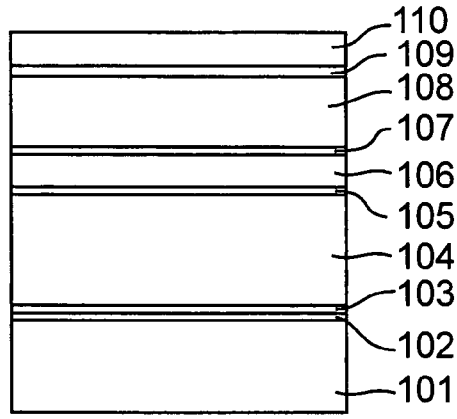
FIGS. 8A through 8C are views showing processes for manufacturing the conventional semiconductor laser device shown in FIG. 7.
Figure 8B:
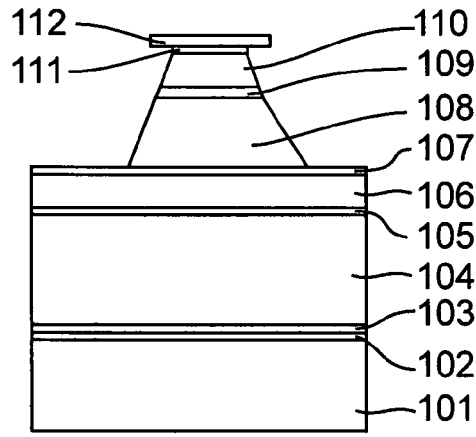
Figure 8C:
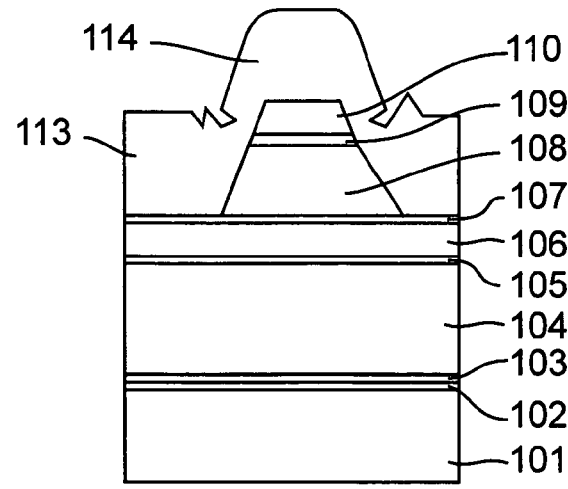
Figure 9A:
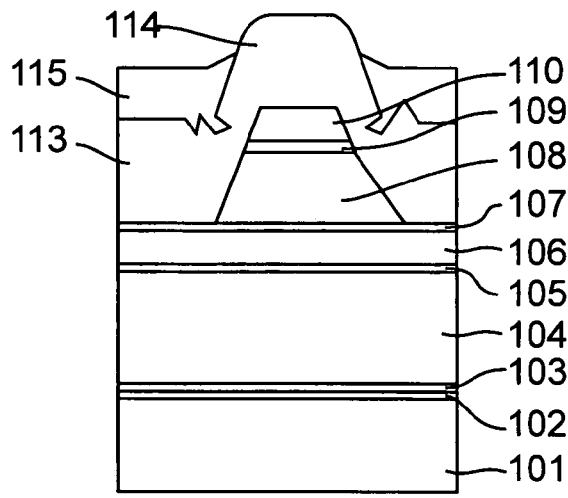
FIGS. 9A through 9C are views showing processes for manufacturing the semiconductor laser device shown in FIG. 7, continued from FIG. 8C.
Figure 9B:
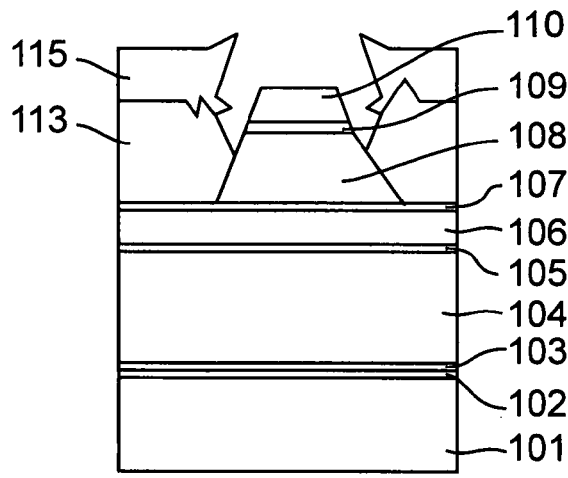
Figure 9C:
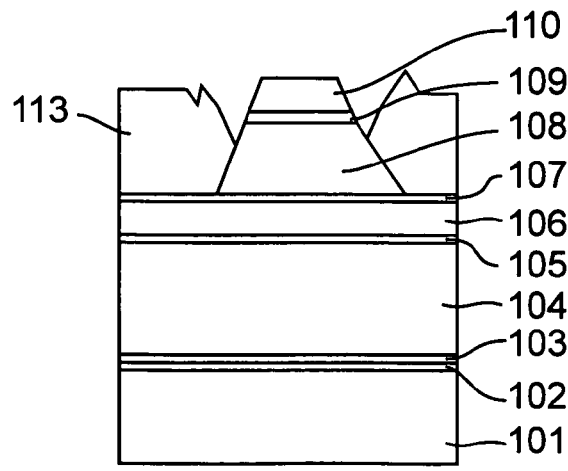

Subsequently, third-time MBE growth is carried out to form the p-type GaAs contact layer 16, and finally, the electrodes 17 and 18 are formed on the upper surface of this p-type GaAs contact layer 16 and the n-type GaAs substrate 1, respectively, obtaining a semiconductor laser device as shown in FIG. 6B.

In the thus-manufactured semiconductor laser device, the n-type AlInP current constriction layer 13 is arranged so as to have a thickness half the thickness of the p-type second clad layer 8 on both sides of the p-type second AlGaInP clad layer 8 of the ridge section without being over-etched. Therefore, the light confinement effect is appropriately secured in the p-type second clad layer 8 during laser oscillation, and the disadvantages of the increase in the threshold current value and the operating current value can be effectively prevented. That is, an AlGaInP-based semiconductor laser device, which can emit light of a red color wavelength in the 600-nm band with sufficiently low values of threshold current and operating current, is obtained.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device, which is provided with an active layer and a first clad layer on a substrate and provided with a ridge section constructed of a second clad layer and upper layers including a cap layer on the first clad layer, the upper layer protruding in both widthwise directions beyond the second clad layer, providing a step of not smaller than 0.13 μm between the upper layers and the second clad layer, wherein a current constriction layer is provided on both sides of the ridge section, and a portion of the current constriction layer, the portion being located outside a portion brought in contact with the ridge section and having surfaces formed flatly, is formed to have a thickness smaller than a thickness of the second clad layer of the ridge section.

2. The semiconductor laser device as claimed in claim 1, wherein a portion of the current constriction layer brought in contact with the ridge section has a thickness of not smaller than half a thickness of the second clad layer of the ridge section.

3. The semiconductor laser device as claimed in claim 1, wherein the substrate is an inclined substrate.

4. A semiconductor laser device manufacturing method comprising the steps of:

forming at least an active layer, a first clad layer, a second clad layer and upper layers including a cap layer on a substrate;

forming a ridge section comprised of the second clad layer and the upper layers by subjecting the second clad layer and the upper layers to dry etching and subsequently to wet etching, the upper layer protruding in both widthwise directions beyond the second clad layer providing a step of not smaller than 0.13 μm between the upper layers end the second clad layer; and forming a current constriction layer provided on both sides of the ridge section, and a portion of the current constriction layer, the portion being located outside a portion brought in contact with the ridge section and having surfaces formed flatly, is formed to have a thickness smaller than a thickness of the second clad layer of the ridge section.

* * * * *